United States Patent [19]
Reisch

[11] Patent Number: 5,706,216
[45] Date of Patent: Jan. 6, 1998

[54] SYSTEM FOR DATA COMPRESSION OF AN IMAGE USING A JPEG COMPRESSION CIRCUIT MODIFIED FOR FILTERING IN THE FREQUENCY DOMAIN

[76] Inventor: Michael L. Reisch, 53 Nathan La., Carlisle, Mass. 01741

[21] Appl. No.: 508,745

[22] Filed: Jul. 28, 1995

[51] Int. Cl.$^6$ .................................................. G06F 17/00
[52] U.S. Cl. ....................................................... 364/715.02
[58] Field of Search .......................... 364/514 R, 514 A, 364/715.02, 728.01; 382/233, 262, 264; 358/433

[56] References Cited

U.S. PATENT DOCUMENTS

| | | | |
|---|---|---|---|
| 5,495,538 | 2/1996 | Fan | 382/233 |
| 5,563,718 | 10/1996 | Wober et al. | 358/433 |

FOREIGN PATENT DOCUMENTS

WO95/15538   6/1995   WIPO .

*Primary Examiner*—Ellis B. Ramirez
*Attorney, Agent, or Firm*—Robert A. Sabourin

[57] ABSTRACT

A system for filtering an image during data compression using a standard JPEG compression/decompression chip typically requires a separate spatial filter external to the chip. The spatial filter is composed of numerous shift registers, flip-flops, multipliers and at least one adder. In contrast, an image filtering system which filters in the frequency domain using the inventive JPEG compression chip modified for filtering in the frequency domain does not require the separate spatial filter and its many components. The modified JPEG chip includes a raster to block converter which converts an image signal into 8×8 blocks, a DCT processor which converts the 8×8 blocks into DCT coefficients, a multiplier which generates filtered DCT coefficients by multiplying predetermined filtering coefficients times the DCT coefficients, a quantizer which generates quantized blocks to a predetermined level stored in a visibility table by quantizing the filtered coefficients, a zigzag scanner which generates a vector having the same number of elements as the quantized blocks, a run-length coder for determining the appropriate run-length according to entropy encoding received from a preloaded Huffman table, and a variable length code packer/unpacker for compressing the entropy encoded vector. A block to raster converter is included to reformat decompressed data.

7 Claims, 4 Drawing Sheets

$$\begin{array}{|llcl|}
\hline
X(1,1) & X(1,2) X(1,3) & \cdots & X(1,n) \\
X(2,1) & X(2,2) X(2,3) & \cdots & X(2,n) \\
X(3,1) & X(3,2) X(3,3) & \cdots & X(3,n) \\
\cdots & & & \\
X(m,1) & X(m,2) X(m,3) & \cdots & X(m,n) \\
\hline
\end{array}$$

FIG. 3A
(PRIOR ART)

$$\begin{array}{|lll|}
\hline
K7 & K8 & K9 \\
K4 & K5 & K6 \\
K1 & K2 & K3 \\
\hline
\end{array}$$

FIG. 3B
(PRIOR ART)

SYSTEM FOR DATA COMPRESSION OF AN IMAGE USING A JPEG COMPRESSION CIRCUIT MODIFIED FOR FILTERING IN THE FREQUENCY DOMAIN

FIELD OF THE INVENTION

This invention relates generally to improved circuitry for image processing and more particularly to a compression circuit using a JPEG (Joint Photographic Experts Group) chip modified for filtering in the frequency domain without the use of a separate spatial filter.

BACKGROUND OF THE INVENTION

Image processing can occur in either the spatial domain or the frequency domain. An image is said to reside in the spatial domain when the values of the parameters used to describe it, such as brightness, have a direct correspondence with spatial location. In the frequency domain, the equivalent to an image in the spatial domain may be represented by a series of frequency components in the form of trigonometric functions which, when summed for each image data point (i.e., pixel) yield the value of the parameter used to characterize the image of that image data point in the spatial domain, and such a representation may be extended to cover all image data points of the image.

In the spatial domain, original image data may be conveniently represented as image data points in a first spatial matrix designated, $s(j,i)$, for a two-dimensional case where the lower case, s, designates the spatial domain, i is the index of rows and j is the index of columns. In the frequency domain, matrices can also be used to mathematically describe an image as a set of the transform coefficients (also referred to as frequency coefficients) which represent frequency data in a transform matrix conventionally designated, $S(v,u)$, where the upper case, S, designates the frequency domain, u is the number of rows, and v is the number of columns.

Spatial image data points may be transformed to frequency space using transformations such as Fourier transforms or discrete cosine transforms (DCTs). When the transformation involved is a discrete cosine transformation, the frequency domain is referred to as the DCT domain and the frequency coefficients are referred to as DCT coefficients. Conventionally, transforming data from the spatial domain to the frequency domain is referred to as a forward transformation, whereas transforming data from the frequency domain to the spatial domain is referred to as an inverse transformation. Hence, a forward discrete cosine transformation is defined as a transform that maps an image from the original image data points $s(j,i)$ in the spatial domain to DCT coefficients $S(v,u)$ in the DCT domain according to the basis function of the forward DCT, whereas an inverse discrete cosine transformation (or IDCT) is defined as a transform that maps the DCT coefficients $S(v,u)$ from the DCT domain to reconstructed image data points $s(j,i)$ in the spatial domain according to the basis function of the IDCT.

The use of DCT and IDCT transforms for compressing or decompressing images to reduce memory storage requirements and/or increase transfer and computational speeds is well-known and, in fact, the practice has been adopted as standard in industry by The Joint Photographic Experts Group (JPEG), which was created as part of a joint effort of the Consultative Committee on International Telegraphy and Telephony (CCITT) and The International Standards Organization (ISO). Today, many image processing programs conform to JPEG standards.

Oftentimes filtering of an image is desirable to optimize the appearance of the image. For example, filtering by sharpening enhances blurry images by bringing out high frequency components that represent edges in the image, whereas filtering by smoothing softens or blurs the edges of the image. When the image is segmented into blocks of data prior to filtering, blocking artifacts can occur along the borders of adjacent blocks. These blocking artifacts, too, can be removed from the image by overlapping the adjacent blocks prior to filtering.

Compressing and filtering an image typically utilizes standard JPEG hardware, i.e. a standard JPEG compression chip, a spatial filter, a microcomputer and memory. However, it has been discovered that the standard JPEG chip can be modified as described hereinafter to allow filtering of the image in the frequency domain, which obviates the need for a separate spatial filter. The modified JPEG chip results in both cost savings and miniaturization of circuitry.

Consequently, it is a primary object of this invention to provide an image processing system including JPEG compression chip modified to allow filtering of an image in the frequency domain without the need for a separate spatial filter.

Other objects of the invention will, in part, appear hereinafter and, in part, be obvious when the following detailed description is read in conjunction with the drawings.

SUMMARY OF THE INVENTION

A system for filtering an image during data compression using a standard JPEG compression chip typically requires a separate spatial filter external to the chip. The spatial filter is composed of numerous shift registers, flip-flops, multipliers and at least one adder. In contrast, an image filtering system using the inventive JPEG compression chip modified for filtering in the frequency domain does not require a separate spatial filter and its many components. The modified JPEG chip includes a raster to block converter which converts an image signal into 8×8 blocks, a DCT processor which converts the 8×8 blocks into DCT coefficients, a multiplier which generates a filtered signal by multiplying predetermined filtering coefficients times the DCT coefficients, a quantizer which generates a quantized signal by dividing predetermined values stored in a visibility table into the filtered signal, a zigzag scanner which generates a vector having the same number of elements as the quantized blocks, a run-length coder for producing a run-length code of the vector, and a variable length code packer for receiving and coding the run-length code in accordance with a predetermined Huffman code retrieved from a Huffman table to produce a compressed, filtered signal. A block to raster converter is included in the modified JPEG chip to reformat decompressed data.

BRIEF DESCRIPTION OF THE DRAWINGS

The aforementioned aspects and other features of the invention are described in detail in conjunction with the accompanying drawings in which the same reference numerals are used throughout for denoting corresponding elements and wherein:

FIG. 3A is an m×n (read "m by n") matrix representation of a digital image to be filtered;

FIG. 3B is a representation of a 3×3 filter kernel useful for filtering the image represented in FIG. 3A.

DETAILED DESCRIPTION OF THE PREFERRED EMBODIMENTS

Figure 1:
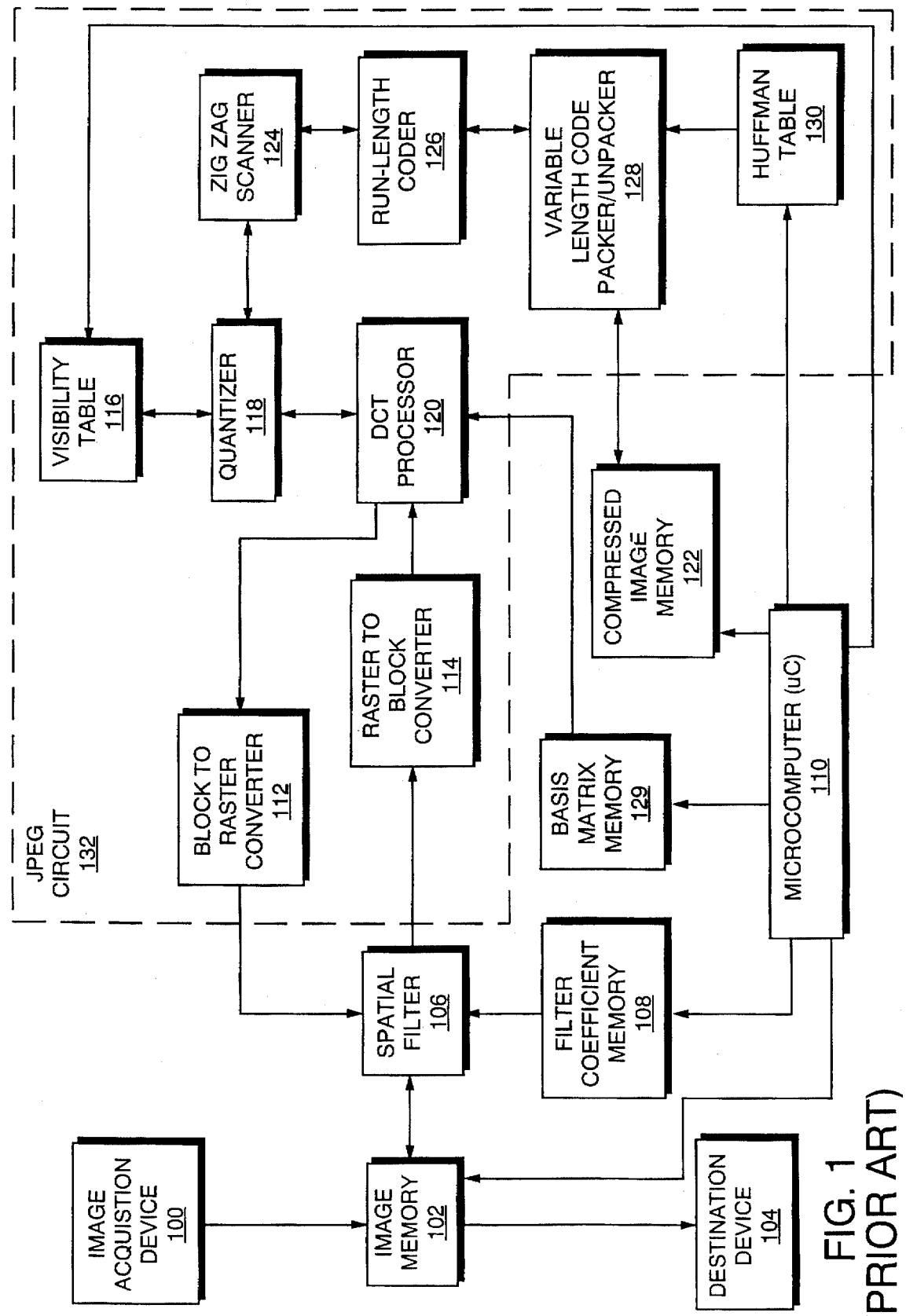
FIG. 1 is a block diagram of a system for compressing and filtering an image using a standard JPEG compression chip and a spatial filter.

The present invention is directed towards a system that uses an improved JPEG compression chip modified for faltering a digital image in the frequency domain without the need for a separate spatial filter. Turning to the filtering system of FIG. 1, an image acquisition device 100 (i.e. an image signal source), such as but not limited to an electronic still camera, a camcorder, a scanner, a charge-coupled device (CCD), or a charge-injected device (CID), captures and converts an image of a scene (not shown) into spatially correlated digital image data points or pixels representing some predetermined characteristic of the image, such as luminance, chrominance, etc. In this particular example, the image acquisition device 100 is a scanner which scans the scene to produce the image in raster format. The scanned image is stored in image memory 102, then filtered in the spatial domain in spatial filter 106 by multiplying predetermined filter coefficients received from filter coefficient memory 108 times the image data points received from the image memory 102. The spatially filtered image data points are then received by the standard JPEG circuit 132 (to be explained in detail hereinafter) where compression and decompression take place. A basis memory 129 is used to store predetermined DCT and IDCT basis coefficients necessary for DCT processing. After the spatially filtered image is compressed in JPEG circuit 132, the compressed image is stored in compressed image memory 122.

To reconstruct the filtered image to a destination application or device 104 (such as, but not limited to, a printer, memory or display), the compressed image is retrieved from memory 122, decompressed in the standard JPEG circuit 132, and transmitted through the spatial filter 106 in pass-through mode where the reconstructed image data points are finally stored in the image memory 102 before being transferred to the destination device 104. A microcomputer 110 controls various components of the image filtering system as shown. Also, although individual memories 108, 122 and 129 are portrayed, a single memory could just as easily be employed with suitable addressing.

Figure 2:
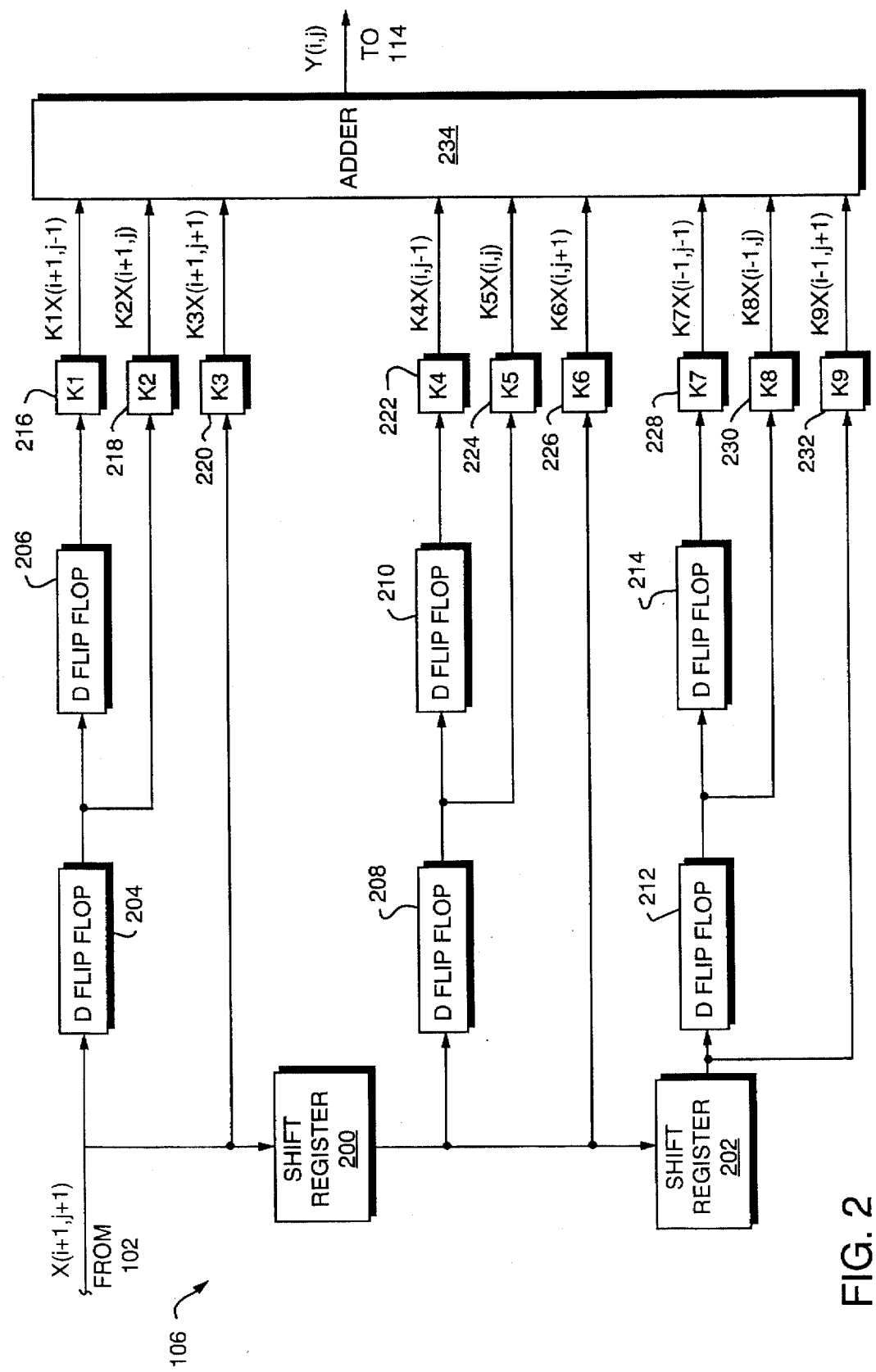
FIG. 2 is a detailed schematic block drawing of the spatial filter 106 of FIG. 1.

The filtering system of FIG. 1 can be more clearly understood in view of the schematic block diagram of FIG. 2 which details the components of the spatial filter 106. Filter 106 generally uses a two-dimensional filter kernel which must be convolved spatially with the image. FIG. 3A depicts the image as an m×n matrix of image data points, and FIG. 3B depicts an exemplary predetermined nine point filter kernel. The spatial filter 106 of FIGS. 1 and 2 includes two shift registers 200, 202, six delay type flip-flops 204, 206, 208, 210, 212, 214, 216, nine multipliers 216, 218, 220, 222, 224, 226, 228, 230, 232 and an adder 234. In the present example, using the filter kernel of FIG. 3B, nine image data points at a time are processed in the spatial filter 106. As will be apparent to those skilled in the art, the filter architecture of FIG. 2 as used with the filtering system of FIG. 1 requires $N^2$ multipliers and an $N^2$ input adder for an N×N kernel size, where N is a predefined integer. Thus, a spatial falter for processing an 8×8 block of image data points in accordance with JPEG standards would require 64 multipliers, numerous D flip-flops and shift registers, and a 64 input adder. A filter with fewer multipliers would be unable to process the 8×8 blocks at the system clock frequency rate.

The image data points received from image memory 102 are input into spatial filter 106 in raster format. Shift registers 200, 202, and delay flip-flops 204, 206, 208, 210, 212, 214 provide proper timing for the pixel stream in the vertical and horizontal directions, respectively, so that all nine inputs to the adder 234 will occur on the same dock pulse. Specifically, kernel element K1 is multiplied in multiplier 216 times image data point X(i+1, j−1), kernel element K2 is multiplied in multiplier 218 times image data point X(i+1, j), kernel element K3 is multiplied in multiplier 220 times X(i+1, j+1), and so forth where i and j are integer indices. The filter coefficients may be hardwired, but are usually stored in data registers which must be loaded from the external filter coefficient memory 108 (see FIG. 1). The ability to load the kernel from storage provides flexibility and makes the implementation of adaptive filtering possible, which is important for certain applications. In the current example, the products of the nine multipliers 216 through 232 are concatenated in adder 234 to yield filter output Y(i,j).

The compression operation of the JPEG circuit 132 begins when the raster to block converter 114 converts the filter output Y(i,j) to block format, i.e. a plurality of (overlapped or unoverlapped) 8×8 element arrays of filtered image data points. A forward DCT is performed on each filtered array of image data points in DCT processor 120 to generate a matrix of DCT coefficients by multiplying the array of filtered image data points times the predetermined forward DCT basis matrix stored in basis matrix memory 129. In this example, each DCT coefficient is represented by eight bits, whereby the DCT coefficients in the upper left-hand corner of the DCT matrix represent direct current and low frequency harmonics to which the human eye is most sensitive. The DCT coefficients are quantized, i.e. scaled, into quantized blocks in quantizer 118 so that the quantizer 118 retains most of the low frequency information and truncates much of the high frequency harmonics as unwanted noise, thus resulting in compression. The level of quantization is predetermined and stored in the quantization table 116, also called a visibility table, which contains entries for determining how many bits should be assigned to each DCT coefficient during quantization. The visibility table 116 can be determined empirically or by analyzing eye threshold sensitivity.

Each quantized block is input and converted by the zigzag scanner 124 (the operation of which is well known in the art) into a vector having the same number of elements as the quantized block. The vector from zigzag scanner 124 is processed in run-length coder 126 to determine the appropriate run-length code according to the Huffman code, i.e. entropy coding, received from preloaded Huffman table 130. The variable length code packer/unpacker 128 compresses the entropy encoded vector. Finally, the compressed data is stored in compressed image memory 122.

The compressed, filtered image stored in the compressed image memory 122 is reconstructed by first, unpacking in the variable length code packer/unpacker 128 to generate decompressed data. The decompressed data then passes through the run-length coder 126 to the zigzag scanner 124 where it is reinstated into block format. The block formatted data from the zigzag scanner 124 then passes through the quantizer 118 to the DCT processor 120 where an IDCT is performed to generate a block of IDCT coefficients by multiplying the block formatted data times the predetermined IDCT basis coefficients stored in basis matrix memory 129. In the case of adjacent overlapped blocks, overlapped IDCT coefficients corresponding to overlapped sections of the adjacent overlapped blocks are discarded by the DCT processor 120. The IDCT coefficients are converted to raster format in block to raster converter 112, then the converted coefficients pass through the spatial filter 106 without processing and are stored in image memory 102 prior to being transmitted to the destination device 104. Of course, the microcomputer 110 controls the various components of the image filtering system.

Figure 4:
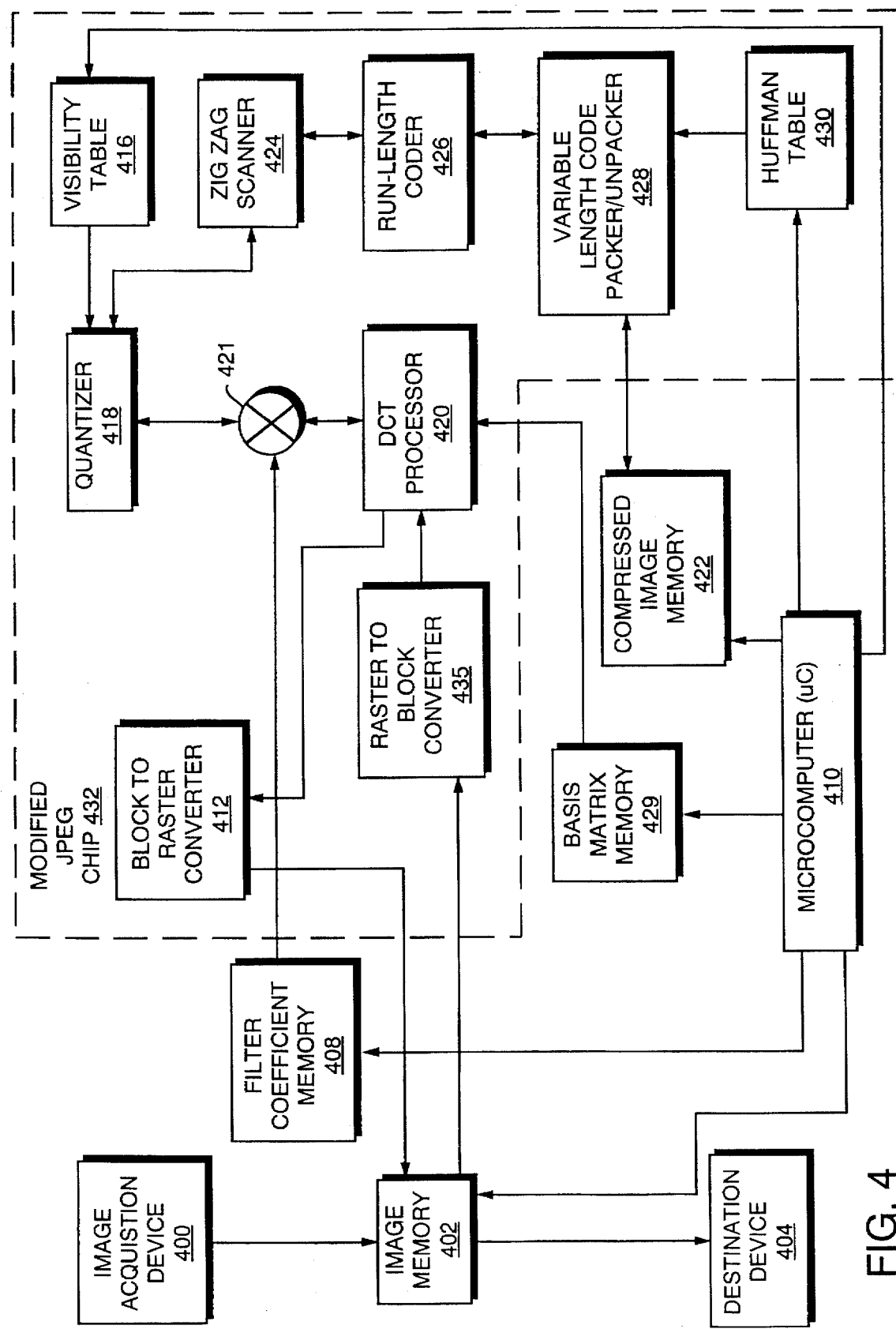
FIG. 4 is a schematic block diagram of a system for compressing and filtering an image according to the invention using a JPEG chip modified for filtering in the frequency domain without the need for a separate spatial filter.

FIG. 4 illustrates a preferred embodiment of a data compression and filtering system according to the invention which processes the image without the use of a separate spatial filter. Using the JPEG chip 432 modified for filtering in the frequency domain, filtering typically occurs prior to compression (as in the preferred embodiment explained hereinafter), although the chip could be easily further altered as understood by those skilled in the art to allow compression prior to filtering if desired. Additionally, the chip 432 could be used for compression only, without any filtering.

The modified JPEG chip 432 requires a single multiplier 421 placed in the data path between the DCT processor 420 and the quantizer 418. The multiplier 421 multiplies the DCT coefficients times the predetermined frequency domain filter coefficients stored in filter coefficient memory 408, yielding a filtered signal. The multiplier 421 includes a pass-through mode to ensure that data can flow unmodified back and forth between the quantizer 418 and the DCT processor 420, allowing the modified JPEG circuit 432 to be operated solely for compression without filtering, if desired.

The image filtering circuit of FIG. 4, including the JPEG chip 432 modified for filtering in the frequency domain, facilitates filtering of a spatial image in the frequency domain in a manner similar to a mathematical convolution in the spatial domain using a discrete odd cosine transform of overlapped blocks of image data points as described and taught in International Application No. PCT/US94/13617 filed 29 Nov. 1994 by Wober and Reisch, herein incorporated by reference in its entirety. The circuit of FIG. 4 is also amenable to filtering unoverlapped blocks of image data points.

In the overlapped mode, the convolution (i.e. filtering in the frequency domain in a manner similar to performing a mathematical convolution in the spatial domain) is mathematically exact and requires three passes through the modified JPEG chip 432 to produce a filtered and compressed image. On the first pass, the overlapped blocks are frequency weighted by the filter response, compressed without loss, and stored in the compressed image memory 422 as the filtered signal of blocks of frequency coefficients. The degree of overlap is determined by the size of the preselected filter kernel, which is the same as for the fast convolution FFT (fast fourier transform) algorithm described by E. O. Brigham in "The Fast Fourier Transform"; Prentice-Hall 1974, Chapter 13, section 13-4, pages 217-221. Lossless compression is achieved by adjusting the values of the visibility table 416 so that none of the DCT coefficients of the filtered blocks is truncated during quantization. This ensures that the filtered blocks can be recovered exactly. Also, the values of the quantization or visibility table 416 can be set as either lossless or lossy depending on the application. The performance of the run length coder 426 and the variable length code packer/unpacker 428 is such that compression ratios of 2:1 to 4:1 are possible depending upon the image entropy desired.

On the second pass in the overlapped mode, the data flow is reversed. That is, the blocks of frequency coefficients stored in the compressed image memory 422 are decoded and inverse transformed back to the spatial domain. The compressed blocks of frequency coefficients are retrieved from memory 422 and decompressed in unpacker 428. The coefficients then pass through the run-length coder 426 to the zigzag scanner 424 where the coefficients are reinstated into block format. The block formatted coefficients from the zigzag scanner 424 then pass through the quantizer 418 and the multiplier 421 without processing to the DCT processor 420 where an IDCT is performed to generate a block of IDCT coefficients by multiplying the block formatted data coefficients times the predetermined IDCT basis coefficients stored in basis matrix memory 429. Overlapped IDCT coefficients corresponding to overlapped sections of the adjacent overlapped blocks are discarded by the DCT processor 420. The remaining IDCT coefficients are converted to raster format in block to raster converter 412, then the converted coefficients are stored in image memory 402.

To generate the final compressed and filtered coefficients of the image in the overlapped mode requires a third pass through the modified JPEG compression chip 432. The coefficients representing the image have already been filtered in the first pass and predetermined decompressed data corresponding to overlapped portions of the reconstructed blocks have been discarded during the second pass. The third pass is solely concerned with the compression of the remaining filtered coefficients into the frequency domain. For the third pass, the blocks of reconstructed image data points from image memory 402 are not overlapped. The coefficients are sent from image memory 402 to raster to block converter 435 which converts the coefficients into 8×8 non-overlapped blocks. The discrete cosine transform of each block is taken in DCT processor 420, then the DCT coefficients pass through the multiplier 421 (since no additional filtering is necessary) to quantizer 418. The DCT coefficients are quantized into quantized blocks in quantizer 418 so that the quantizer 418 retains most of the low frequency information and truncates much of the high frequency harmonics as unwanted noise. The level of quantization is predetermined and stored by the values in the visibility table 416, which can be set as either lossless or lossy depending on the application and, which contains entries for determining how many bits should be assigned to each DCT coefficient during quantization.

Each quantized block is input and converted by the zigzag scanner 424 into a vector having the same number of elements as the quantized blocks. The vector from zigzag scanner 424 is processed in run-length coder 426 to determine the appropriate run-length code according to the Huffman code, i.e. entropy coding, received from preloaded Huffman table 430. The variable length code packer/ unpacker 428 compresses the entropy encoded vector. Finally, the compressed data is stored in compressed image memory 422.

The compressed, filtered image stored in the compressed image memory 422 can be reconstructed by first, unpacking in the variable length code packer/unpacker 428 to generate decompressed data. The decompressed data then passes through the run-length coder 426 to the zigzag scanner 424 where it is reinstated into block format. The block formatted data from the zigzag scanner 424 then passes through the quantizer 418 and the multiplier 421 without processing to the DCT processor 420 where an IDCT is performed in accordance with an IDCT basis matrix stored in the basis matrix memory 429 to generate a block of IDCT coefficients. The IDCT coefficients are converted to raster format in block to raster converter 412, then the converted coefficients are stored in the image memory 402 prior to being transmitted to the destination application or device 404. The microcomputer 410 controls the various components of the image filtering system.

For many applications, filtering an image to produce an exact convolution is unnecessary. Alternatively, blocks of non-overlapped image data can be filtered and otherwise processed by a single pass (rather than three passes as described above) through the modified JPEG chip 432. The single pass method results in a tradeoff of increased processing speed and compromised image quality. The image data points stored in image memory 402 are sent to raster to block converter 435 which converts the data into 8×8 non-overlapped blocks. A DCT of each block is taken in DCT processor 420 to generate DCT coefficients. A filtered signal of filtered coefficients is generated in multiplier 421 by multiplying the DCT coefficients times predetermined filter coefficients stored in filter coefficient memory 408. The filtered coefficients are quantized into quantized blocks in quantizer 418 so that the quantizer 418 retains most of the low frequency information and truncates much of the high frequency harmonics as unwanted noise. The level of quantization is predetermined and stored by the values in the visibility table 416, which can be set as either lossless or lossy depending on the application and, which contains entries for determining how many bits should be assigned to each DCT coefficient during quantization.

Each quantized block is input and converted by the zigzag scanner 424 into a vector having the same number of elements as the quantized blocks. The vector from zigzag scanner 424 is processed in run-length coder 426 to determine the appropriate run-length code according to the Huffman code, i.e. entropy coding, received from preloaded Huffman table 430. The variable length code packer/unpacker 428 compresses the entropy encoded vector. Finally, the compressed data is stored in compressed image memory 422.

The compressed, filtered image stored in the compressed image memory 422 can be reconstructed by first, unpacking in the variable length code packer/unpacker 428 to generate decompressed data. The decompressed data then passes through the run-length coder 426 to the zigzag scanner 424 where it is reinstated into block format. The block formatted data from the zigzag scanner 424 then passes through the quantizer 418 and the multiplier 421 without processing to the DCT processor 420 where an IDCT is performed to generate a block of IDCT coefficients stored in the basis matrix memory 429. The IDCT coefficients are converted to raster format in block to raster converter 412, then the converted coefficients are stored in the image memory 402 prior to being transmitted to the destination device 404. The microcomputer 410 controls the various components of the image filtering system.

It is to be understood that the above described embodiments are merely illustrative of the present invention and represent a limited number of the possible specific embodiments that can provide applications of the principles of the invention. Numerous and varied other arrangements may be readily devised in accordance with these principles by those skilled in the art without departing from the spirit and scope of the invention as claimed.

What is claimed is:

1. A JPEG compatible compression and filtering chip for operation in a frequency domain, said chip comprising:

a raster to block converter for receiving an electronic signal representing an image and converting said electronic signal from raster to block format;

basis matrix input means for receiving a forward DCT basis matrix from an external basis matrix memory;

a discrete cosine transform (DCT) processor for receiving said block formatted electronic signal from the raster to block converter, receiving said forward DCT basis matrix via said basis matrix input means, and performing a discrete cosine transform of said block formatted electronic signal to generate DCT coefficients;

a multiplier for receiving said DCT coefficients, receiving said predetermined frequency filter coefficients, and multiplying said DCT coefficients and said predetermined frequency domain filter coefficients to generate a filtered signal;

a quantizer for receiving predetermined quantization values from a visibility table, receiving said filtered signal, dividing said predetermined quantization values into said filtered signal to produce a quotient, and truncating the quotient to a predefined accuracy to generate a quantized signal;

a zigzag scanner for producing a vector representing said quantized signal;

a run-length coder for producing a run-length code of said vector; and a variable length code packer for receiving and coding said run-length code in accordance with a predetermined Huffman code retrieved from a Huffman table to produce a compressed, filtered signal.

2. The JPEG compatible compression and filtering chip of claim 1, further comprising:

means for unpacking said compressed, filtered signal to reproduce said run-length code;

means for reproducing said vector from said reproduced run-length code;

means for reproducing said quantized signal from said reproduced vector;

means for reproducing said filtered signal from said reproduced quantized signal;

means for receiving an inverse basis matrix from said basis matrix memory, receiving said reproduced filtered signal, and performing an inverse discrete cosine transform (IDCT) of said reproduced filtered signal to generate IDCT coefficients; and a block to raster converter for receiving and converting said IDCT coefficients from block to raster format to generate a reproduced said electronic signal.

3. The JPEG compatible compression and filtering chip of claim 2, wherein said block formatted electronic signal comprises adjacent overlapped blocks, and wherein said means for performing an DCT further comprises means for discarding overlapped IDCT coefficients corresponding to overlapped sections of said adjacent overlapped blocks.

4. A system for compressing and filtering an image, said system comprising:

an image acquisition device for capturing and converting said image to an electronic signal;

an image memory for storing said electronic signal;

a JPEG compatible compression and filtering chip for operation in a frequency domain, said chip capable of receiving said electronic signal from said image memory and generating a filtered signal in the frequency domain; and means for controlling the system.

5. The system of claim 4, further comprising a basis matrix memory, a filter coefficient memory, a visibility table, and a Huffman table, wherein said JPEG JPEG compatible compression and filtering chip comprises:

- a raster to block converter for converting said electronic signal into block format;
- a discrete cosine transform (DCT) processor for generating DCT coefficients by performing a DCT of said block formatted electronic signal in response to a forward DCT basis matrix retrieved from said basis matrix memory;
- a multiplier for generating said filtered signal by multiplying said DCT coefficients times predetermined filter coefficients retrieved from said filter coefficient memory;
- a quantizer for quantizing said filtered signal in response to predetermined values retrieved from said visibility table to generate a quantized signal;
- a zigzag scanner for producing a vector representing said quantized signal;
- a run-length coder for producing a run-length code of said vector; and
- a variable length code packer for producing a compressed, filtered signal by coding said run-length code in accordance with a predetermined Huffman code retrieved from said Huffman table.

6. The system of claim 5, further comprising:

- means for unpacking said compressed, filtered signal to reproduce said run-length code;
- means for reproducing said vector from said reproduced run-length code;
- means for reproducing said quantized signal from said reproduced vector;
- means for reproducing said filtered signal from said reproduced quantized signal;
- means for receiving an inverse discrete cosine transform (IDCT) basis matrix from said basis matrix memory, receiving said reproduced filtered signal, and performing an IDCT of said reproduced filtered signal to generate IDCT coefficients; and
- a block to raster converter for receiving and converting said IDCT coefficients from block to raster format to generate a reproduced said electronic signal.

7. The system of claim 6, wherein said block formatted electronic signal comprises adjacent overlapped blocks, and wherein said means for performing an IDCT further comprises means for discarding overlapped IDCT coefficients corresponding to overlapped sections of said adjacent overlapped blocks.

* * * * *